United States Patent
Jalaleddine et al.

(10) Patent No.: US 6,924,674 B2
(45) Date of Patent: Aug. 2, 2005

(54) COMPOSITE SOURCE FOLLOWER

(75) Inventors: Sateh M. Jalaleddine, Santa Clara, CA (US); Suharli Tedja, Fremont, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/694,246

(22) Filed: Oct. 27, 2003

(65) Prior Publication Data
US 2005/0088205 A1 Apr. 28, 2005

(51) Int. Cl.$^7$ .............................................. H03K 3/00
(52) U.S. Cl. ...................................... 327/112; 327/356
(58) Field of Search .......................... 327/66, 108–112, 327/355, 356; 326/82, 83

(56) References Cited

U.S. PATENT DOCUMENTS

| | | | |
|---|---|---|---|
| 6,437,628 B1 * | 8/2002 | Davenport et al. | ......... 327/333 |
| 6,590,422 B1 * | 7/2003 | Dillon | ......................... 326/86 |
| 6,801,059 B2 * | 10/2004 | Lee | .............................. 327/65 |
| 2002/0175761 A1 | 11/2002 | Bach et al. | ................. 330/277 |

OTHER PUBLICATIONS

"Analysis and Design of Analog Integrated Circuits" by Paul R. Gray et al., Copyright 2001 John Wiley & Sons, Inc. pp. 213-215.

* cited by examiner

Primary Examiner—Kenneth B. Wells
(74) Attorney, Agent, or Firm—Steve Mendelsohn

(57) ABSTRACT

A folded cascode device senses the drain current of a source follower, and a current mirror device multiplies the sensed drain current for application to an output load. The source follower and the current mirror device are preferably of the same type (e.g., both NMOS). The resulting composite source follower provides relatively wide bandwidth at relatively low power. The folded cascode allows (NMOS) source and sink control. Using current mirror feedback reduces the stability problems associated with other solutions that rely on a voltage feedback stage. Composite source followers of the present invention can be used in any traditional buffer applications, such as in operational amplifiers, regulators, or high-speed signal paths.

20 Claims, 1 Drawing Sheet

COMPOSITE SOURCE FOLLOWER

BACKGROUND OF THE INVENTION

1. Field of the Invention

The present invention relates to electronics, and, in particular, to source follower circuits.

2. Description of the Related Art

Source followers are used to buffer signals and provide low output impedance to drive resistive loads. Traditional source followers have load drive capability limited to the quiescent current in the buffer. In addition, traditional source followers require too much power for many applications.

To reduce power dissipation (and area) required to reach a given output resistance, a super source follower configuration is sometimes used. See P. R. Gray, P. J. Hurst, S. H. Lewis, and R. G. Meyer, *Analysis and Design of Analog Integrated Circuits*, $4^{th}$ ed., John Wiley & Sons, Inc., New York, 2001, pp. 213–215, the teachings of which are incorporated herein by reference. Unfortunately, the PMOS boost of this solution is too slow for many applications.

U.S. Patent Publication No. 2002/0175761 A1 (Bach et al.), the teachings of which are incorporated herein by reference, describes a PMOS version of a folded source follower. Unfortunately, this PMOS super source follower is also too slow for many applications.

SUMMARY OF THE INVENTION

Problems in the prior art are addressed in accordance with the principles of the present invention by a composite source follower with enhanced drive. According to certain embodiments of the present invention, the drain current of a source follower (e.g., an NMOS source follower) is sensed, e.g., with a folded cascode device. The sensed current from the folded cascode is multiplied to the output load using a current mirror device of the same type as the source follower.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
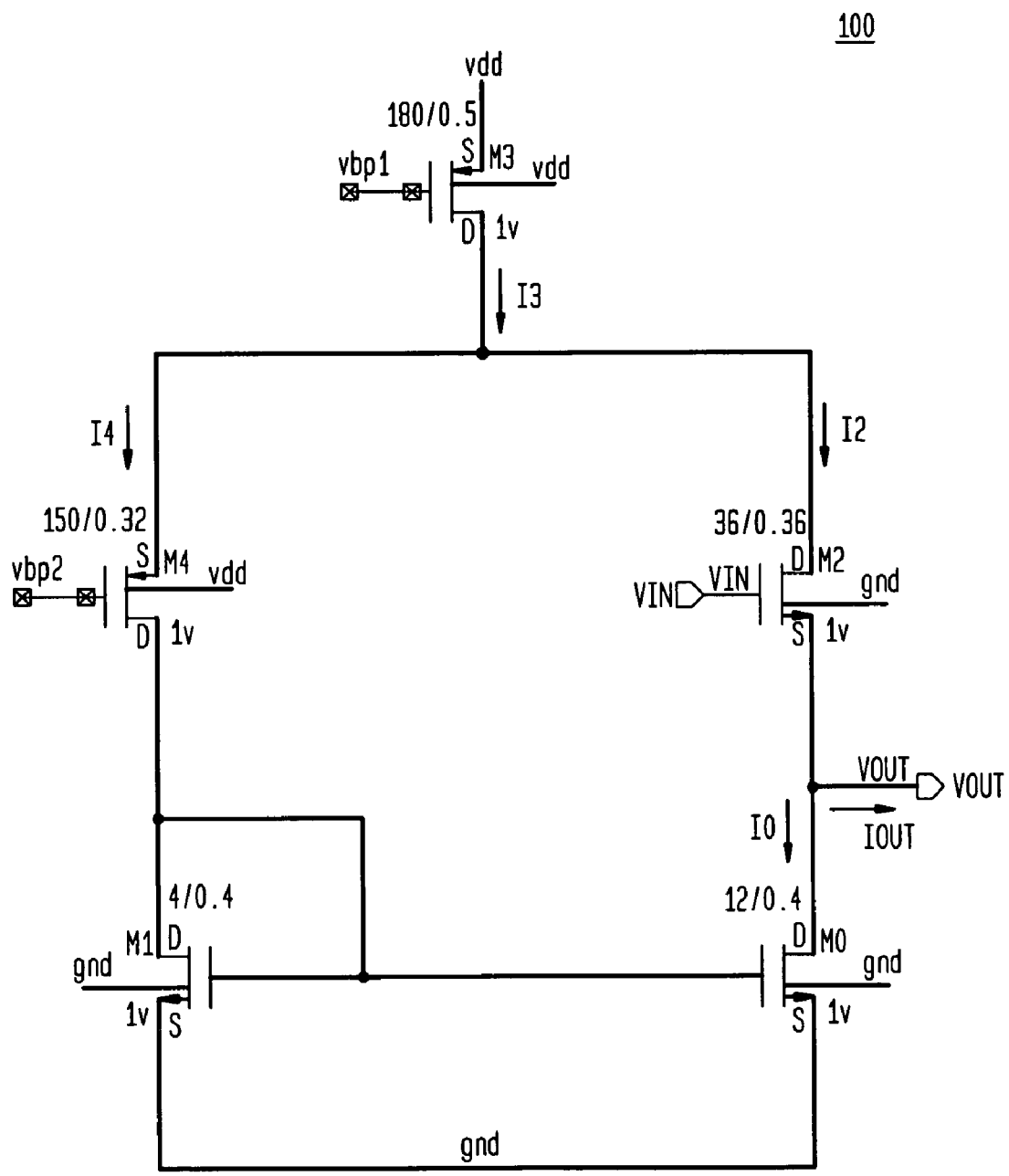
FIG. 1 shows a schematic circuit diagram of a composite source follower, according to one embodiment of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments.

FIG. 1 shows a schematic circuit diagram of a composite source follower 100, according to one embodiment of the present invention. At a functional level, composite source follower 100 comprises a current source configured to provide a (relatively) constant current to the rest of the circuit, a source follower configured to receive an input signal VIN, a folded cascode device connected to sense the drain current of the source follower, and a current mirror device connected to multiply the sensed drain current for application to an output load connected at the source follower output VOUT.

At the device level, composite source follower 100 comprises five MOS transistors M0–M4. In the implementation shown in FIG. 1, transistors M0–M2 are NMOS devices, and transistors M3–M4 are PMOS devices. In an alternative implementation, M0–M2 may be PMOS devices and M3–M4 may be NMOS devices.

As shown in FIG. 1, the source of transistor M3 is connected to the supply voltage Vdd, the gate of M3 is connected to bias voltage vbp1, and the drain of M3 is connected to (1) the source of transistor M4 and (2) the drain of transistor M2.

The gate of transistor M4 is connected to bias voltage vbp2, and the drain of M4 is connected to (1) the drain of transistor M1, (2) the gate of M1, and (3) the gate of transistor M0.

The source of transistor M1 is connected to ground.

The gate of transistor M2 is connected to the input voltage VIN, and the source of M2 is connected to (1) the drain of transistor M0 and (2) the output voltage VOUT.

The source of transistor M0 is connected to ground.

Transistor M3 functions as a (relatively) constant current source for composite source follower 100, with the current from M3 being divided between transistor M4 and transistor M2. The gate bias voltage vbp1 is preferably selected to ensure that transistor M3 stays in saturation for all expected operations of composite source follower 100.

Transistors M0 and M2 are configured as a source follower. In particular, with the input VIN applied to the gate of M2, and both the source of M2 and the drain of M0 connected to the output VOUT, the voltage at output VOUT will be proportional to (i.e., will follow) the voltage applied at input VIN.

Transistors M0 and M1 are configured as current mirrors, with the current through M0 mirrored by (i.e., proportional to) the current through M1, and vice versa. In the implementation of FIG. 1, M0 is three times the size of M1. As such, the current through M0 will be approximately three times as large as the current through M1. In other implementations, this ratio of 3:1 may be different. Depending on the requirements of the particular circuit application, the magnitude of the ratio may be limited by the stability of the circuit, e.g., to a maximum of about 4:1.

With an appropriate gate bias voltage vbp2 applied, transistor M4 functions as a folded cascode device that senses the drain current of transistor M2. The sensed current is then multiplied by the current mirror. M4 acts as a current buffer of gain 1 that prevents the current mirror from being overloaded.

When an input voltage signal is applied at input VIN, a portion of the signal goes to the output VOUT via the gate-to-source of M2, while another portion of the signal goes to the output VOUT via the gate-to-drain of M2, through M4, and through the gate-to-drain of M0. This second signal path functions as a signal feed-back path in composite source follower 100. The effect of this feed-back signal is to reduce the voltage at output VOUT even more than the voltage reduction from the first signal path (i.e., the gate-to-source of M2). As a result, the voltage at output VOUT will be a smaller fraction of the voltage at input VIN than if the circuitry included only the source follower combination of transistors M0 and M2. As such, composite source follower 100 can be used as a buffer for applications in which the output VOUT is to be connected to drive relatively low-impedance loads.

Another way to look at the operations of composite source follower 100 is to analyze the current flow. The current 13 from current source M3 is divided into a current 12 to transistor M2 and a current 14 to transistor M4, where I3=I2+I4. The current 12 is itself divided into a current Iout at VOUT and a current 10 through transistor M0, where I2=Iout+I0.

An increase in the voltage applied at input VIN causes the current 12 through M2 to increase. As a result, the current 14 through transistor M4 (and therefore through transistor M1) decreases. This decrease in current through M1 is mirrored by a decrease in current through M0, where the decrease in current is multiplied by a factor of 3. This amplified decrease in the current 10 through M0 causes an increased fraction of the current 12 to flow to VOUT as current Iout.

The result is an increase in the overall transconductance of composite source follower 100 as compared to the source follower configuration of transistors M2 and M0 alone. In particular, the overall transconductance of composite source follower 100 is (I+Loop_gain), where Loop_gain is a function of the ratio of the transistors in the current mirror (e.g., 3 for the implementation of FIG. 1). Thus, composite source follower 100 provides a four-fold increase in transconductance as compared to the source follower of M2 and M0 alone.

As used in the following claims, the term "channel nodes" refer to the source and drain of a transistor.

The invention has been described in the context of a composite source follower comprising a constant current source, a source follower, a folded cascode device that senses the drain current of the source follower, and a current mirror that multiplies the sensed drain current, each of which has been described as being implemented in composite source follower 100 of FIG. 1 with specific types of devices. Those skilled in the art will understand that the invention can also be implemented using different devices. For example, the particular sizes of the individual devices might also change depending on the particular application. As mentioned previously, the NMOS devices may be replaced with PMOS devices, and vice versa. Furthermore, devices of suitable technologies other than MOS can be used, such as bipolar technology. For bipolar implementations, for example, the terms drain, source, and gate used in both this specification and in the following claims will be understood to refer to the collector, emitter, and base, respectively, of bipolar devices. Moreover, each of the constant current source, the source follower, the folded cascode device, and the current mirror might be able to be implemented using different configurations of devices to achieve similar or analogous functions.

Although the present invention is preferably implemented as part of a single integrated circuit, it may also be implemented using discrete devices.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A method for processing electrical signals, comprising:
   applying an input signal to a source follower;
   sensing drain current of the source follower;
   multiplying the sensed drain current; and
   applying the multiplied sensed drain current to an output of the source follower.

2. The invention of claim 1, wherein a folded cascode device senses the drain current.

3. The invention of claim 1, wherein a current mirror multiplies the sensed drain current.

4. The invention of claim 3, wherein:
   the source follower and the current mirror are both implemented using a first type of device; and
   the drain current is sensed using a device of a second different from the first type.

5. The invention of claim 4, wherein:
   the source follower and the current mirror are both implemented using NMOS devices;
   the device used to sense the drain current is implemented using a PMOS device.

6. The invention of claim 1, further comprising applying a current generated by a current source to both the source follower and a device used to sense the drain current of the source follower.

7. A circuit comprising:
   a source follower;
   a first device connected to sense drain current of the source follower; and
   a current mirror connected to multiply the sensed drain current for application to an output of the source follower.

8. The invention of claim 7, wherein the first device is a folded cascode device.

9. The invention of claim 7, wherein:
   the source follower and the current mirror are both implemented using a first type of device; and
   the first device is of a second different from the first type.

10. The invention of claim 9, wherein:
    the source follower and the current mirror are both implemented using NMOS devices; and
    the first device is implemented using a PMOS device.

11. The invention of claim 7, wherein the circuit is an integrated circuit.

12. The invention of claim 7, further comprising a current source connected to apply a current to both the source follower and the first device.

13. A circuit comprising:
    a transistor M3;
    a transistor M2 connected at a first channel node to a second channel node of the transistor M3, wherein:
      a gate node of the transistor M2 is connected to an input VIN; and
      a second channel node of the transistor M2 is connected to an output VOUT;
    a transistor M0 connected at a first channel node to the output VOUT;
    a transistor M4 connected at a first channel node to the second channel node of the transistor M3; and
    a transistor M1 connected at a first channel node and a gate node to a second channel node of the transistor M4 and to a gate node of the transistor M0, wherein a second channel node of the transistor M1 is connected to a second channel node of the transistor M0.

14. The invention of claim 13, wherein, when (1) a first channel node of the transistor M3 is connected to a first supply voltage, (2) the second channel nodes of the transistors M0 and M1 are connected to a second supply voltage, (3) a gate node of the transistor M3 is connected to a first gate bias voltage, and (4) a gate node of the transistor M4 is connected to a second gate bias voltage, an output voltage appearing at the output VOUT is proportional to an input voltage applied at the input VIN.

15. The invention of claim 14, wherein:
the transistor M3 functions as a current source for the circuit;
the transistors M0 and M2 function as a source follower;
the transistors M0 and M1 function as a current mirror;
the transistor M4 senses a drain current at the transistor M2; and
the current mirror multiplies the sensed drain current and applies the multiplied sensed drain current to the output VOUT.

16. The invention of claim 13, wherein:
the transistors M0, M1, and M2 are of a first type; and
the transistors M3 and M4 are of a second type different from the first type.

17. The invention of claim 16, wherein the first type is NMOS transistors and the second type is PMOS transistors.

18. The invention of claim 15, wherein:
the source follower and the current mirror are both implemented using a first type of device; and
the transistor M4 is of a second different from the first type.

19. The invention of claim 18, wherein:
the source follower and the current mirror are both implemented using NMOS devices; and
the transistor M4 is a PMOS device.

20. The invention of claim 13, wherein the circuit is an integrated circuit.

* * * * *